(12) United States Patent
Jiang et al.

(10) Patent No.: US 7,615,420 B2
(45) Date of Patent: Nov. 10, 2009

(54) METHOD FOR MANUFACTURING INDIUM GALLIUM ALUMINIUM NITRIDE THIN FILM ON SILICON SUBSTRATE

(75) Inventors: Fengyi Jiang, Nanchang (CN); Li Wang, Jiang Xi (CN); Wenqing Fang, Jiang Xi (CN)

(73) Assignee: Lattice Power (Jiangxi) Corporation (CN)

( * ) Notice: Subject to any disclaimer, the term of this patent is extended or adjusted under 35 U.S.C. 154(b) by 33 days.

(21) Appl. No.: 12/067,761

(22) PCT Filed: Sep. 26, 2006

(86) PCT No.: PCT/CN2006/002583

§ 371 (c)(1),
(2), (4) Date: Mar. 21, 2008

(87) PCT Pub. No.: WO2007/036163

PCT Pub. Date: Apr. 5, 2007

(65) Prior Publication Data

US 2008/0248633 A1    Oct. 9, 2008

(30) Foreign Application Priority Data

Sep. 30, 2005    (CN) ......................... 2005 1 0030319

(51) Int. Cl.
*H01L 21/84* (2006.01)
*H01L 21/00* (2006.01)
*H01L 21/38* (2006.01)
*H01L 21/22* (2006.01)

(52) U.S. Cl. .................... 438/149; 438/551; 438/552; 438/553; 438/555; 438/671; 257/E21.121; 257/E21.125; 257/E21.127; 257/E21.131

(58) Field of Classification Search .......... 257/E21.121, 257/E21.125, E21.127, E21.131
See application file for complete search history.

(56) References Cited

U.S. PATENT DOCUMENTS 5,152,805 A * 10/1992 Geddes et al. ............. 29/25.02
6,955,932 B2 * 10/2005 Hovel et al. ................... 438/17

* cited by examiner

*Primary Examiner*—Savitri Mulpuri
*Assistant Examiner*—Mohsen Ahmadi
(74) *Attorney, Agent, or Firm*—Park, Vaughan & Fleming LLP

(57) ABSTRACT

The method for manufacturing the indium gallium aluminium nitride (InGaAlN) thin film on silicon substrate, which comprises the following steps: introducing magnesium metal for processing online region mask film, that is, or forming one magnesium mask film layer or metal transition layer; then forming one metal transition layer or magnesium mask layer, finally forming one layer of indium gallium aluminium nitride semiconductor layer; or firstly forming one layer of metal transition layer on silicon substrate and then forming the first indium gallium aluminium nitride semiconductor layer, magnesium mask layer and second indium gallium aluminium nitride semiconductor layer in this order. This invention can reduce the dislocation density of indium gallium aluminium nitride materials and improve crystal quality.

19 Claims, 1 Drawing Sheet

METHOD FOR MANUFACTURING INDIUM GALLIUM ALUMINIUM NITRIDE THIN FILM ON SILICON SUBSTRATE

RELATED APPLICATION

This application is a national-stage application of and hereby claims priority under 35 U.S.C. § 365(c) to the PCT Application No PCT/CN2006/002583, filed 29 Sep. 2006, which claims priority to China Patent Application No. 200510030319.X, filed 30 Sep. 2005.

TECHNOLOGY FIELD

The present invention relates to a semiconductor material, and, more specifically, to a method for fabricating InGaAlN thin film on a silicon substrate.

BACKGROUND TECHNOLOGY $In_xGa_yAl_{1-x-y}N$ (0<=x<=1, 0<=y<=1) is one of the materials of choice for fabricating short wavelength light-emitting devices. In recent years, researchers worldwide have developed many novel InGaAlN-based light-emitting devices, such as blue, green, and white light-emitting diodes (LEDs), and violet semiconductor lasers. Meanwhile, InGaAlN is also a good material for manufacturing high-performance electronic devices. Among existing technologies, methods for fabricating InGaAlN materials on sapphire and SiC substrates are relatively mature. Based on these publicly available technologies, one can fabricate high-quality InGaAlN materials. However, since SiC substrates are very expensive, using SiC substrates to fabricate InGaAlN can incur high costs. Sapphire is also costly. Furthermore, sapphire is an insulator and is difficult to process. An InGaAlN device fabricated on a sapphire substrate cannot have a vertical electrode configuration. As a result, fabricating InGaAlN devices on a sapphire substrate can be complex and costly. Silicon, being a mature semiconductor material, is not only cheap, but also easy to control in terms of conduction type and resistivity. Moreover, techniques for processing silicon are fairly mature. Using silicon substrates to fabricate InGaAlN materials can significantly reduce the associated costs. However, silicon and InGaAlN materials exhibit considerable lattice and thermal-expansion-coefficient mismatch. Consequently, InGaAlN materials fabricated on a silicon substrate often exhibit high dislocation density. Dislocations in the InGaAlN material can serve as non-radiation recombination centers. Therefore, light-emitting devices fabricated with materials having high dislocation density often exhibit low light-emitting efficiency.

CONTENTS OF INVENTION

One objective of the present invention is to provide a method for fabricating InGaAlN thin film on a silicon substrate. This method can effectively reduce the dislocation density inside the InGaAlN material grown on a silicon substrate, and improves its crystalline quality.

The objectives of the present invention are achieved based on the following detailed explanation.

A method for fabricating $In_xGa_yAl_{1-x-y}N$ (0<=x<=1, 0<=y<=1) thin film on a silicon substrate, the method including the following operations:

forming a magnesium (Mg) mask layer on the silicon (Si) substrate;

forming a metal transition layer on said Mg mask layer;

forming InGaAlN semiconductor layers on said metal transition layer;

wherein said Mg mask layer covers only part of the surface of the Si substrate, the covered area being between 10% and 90% of the total surface area;

wherein the metal transition layer includes an aluminum (Al) layer, a titanium (Ti) layer, or a layer of Al/Ti alloy;

forming a buffer layer after the formation of said metal transition layer and before the formation of said InGaAlN semiconductor layers;

wherein said buffer layer includes an AlN layer.

A method for fabricating $In_xGa_yAl_{1-x-y}N$ (0<=x<=1, 0<=y<=1) thin film on a Si substrate, the method including the following operations:

forming a metal transition layer on the Si substrate;

forming a Mg mask layer on said metal transition layer;

forming InGaAlN semiconductor layers on said Mg mask layer;

wherein said Mg mask layer covers only part of the surface of the metal transition layer, the covered area being between 10% and 90% of the total surface area;

wherein the metal transition layer includes an Al layer, a Ti layer, or a layer of Al/Ti alloy;

forming a buffer layer is formed after the formation of said metal transition layer and before the formation of said InGaAlN semiconductor layers;

wherein said buffer layer includes a layer of AlN.

A method for fabricating $In_xGa_yAl_{1-x-y}N$, 0<=x<=1, 0<=y<=1) thin film on a Si substrate, the method including the following operations:

forming a metal transition layer on the Si substrate;

forming a first InGaAlN semiconductor layer on said metal transition layer;

forming a Mg mask layer on said first InGaAlN semiconductor layer;

forming a second InGaAlN semiconductor layer on said Mg mask layer;

wherein said Mg mask layer covers only part of the surface of the first InGaAlN semiconductor layer, the covered area being between 10% and 90% of the total surface area;

wherein the metal transition layer includes an aluminum (Al) layer, a titanium (Ti) layer, or a layer of Al/Ti alloy;

wherein the thickness of said first InGaAlN semiconductor layer is between 1 mono-atomic layer and 3 µm;

wherein a buffer layer is formed after the formation of said metal transition layer and before the formation of said first InGaAlN semiconductor layer;

wherein said buffer layer includes a layer of AlN.

One objective of the present invention is realized by using Mg for in-situ masking. Because it is difficult to grow InGaAlN on Mg, Mg can be used as a masking material for the growth of InGaAlN.

According to one method provided by the present invention, an Mg mask layer is deposited on a Si substrate, wherein the Mg mask covers part of the surface of the Si substrate. In order to avoid the nitridation of the exposed area which results in the formation of SiN, a layer of Al is deposited on the exposed substrate after the deposition of the Mg mask. As a result, part of the substrate surface is covered by Mg while the rest is covered by Al. This is followed by the growth of InGaAlN material. InGaAlN material starts to grow on Al but not on Mg. However, when the thickness of the InGaAlN material reaches a certain level bypassing that of the Mg mask layer, InGaAlN starts to grow laterally. Because the laterally grown InGaAlN material has low dislocation density, the overall dislocation density of the InGaAlN film fabricated using this method will be reduced. According to one embodiment of the present invention, an intermediate layer of Al is first deposited on a Si substrate. Afterwards, an Mg mask layer is formed partly covering the Al layer. InGaAlN material then starts to grow on the exposed Al. When the thickness of the InGaAlN material reaches a certain level bypassing that of the Mg mask layer, InGaAlN starts to grow laterally. In the end, the laterally grown InGaAlN layer interconnects to form an intact film and starts to grow upward. Similarly, because the laterally grown InGaAlN material has low dislocation density, the overall dislocation density of the InGaAlN film is reduced.

According to one method provided by the present invention, an intermediate layer of Al is first formed on a Si substrate followed by the growth of a first InGaAlN layer which contains a large amount of dislocations. Afterwards, Mg is used for in-situ masking covering part of the surface of the first InGaAlN layer. A second layer of InGaAlN is grown after the masking process. Therefore, part of the first InGaAlN layer, which contains a large amount of dislocations, is covered by Mg, and cannot grow upward continuously, whereas the exposed region continues to grow. When the thickness of the InGaAlN layer reaches a certain level bypassing that of the Mg mask layer, InGaAlN starts to grow laterally. In the end, the laterally grown InGaAlN layer interconnects to form an intact film and starts to grow upward. Similarly, because the laterally grown InGaAlN material has low dislocation density, the overall dislocation density of the second InGaAlN layer is reduced. In this method, the Al layer can be replaced by a Ti layer or an Al/Ti alloy layer.

Therefore, the present invention has the advantages of being able to effectively reduce the dislocation density of InGaAlN material grown on a Si substrate and to improve the crystalline quality of the InGaAlN material.

Figure 1:
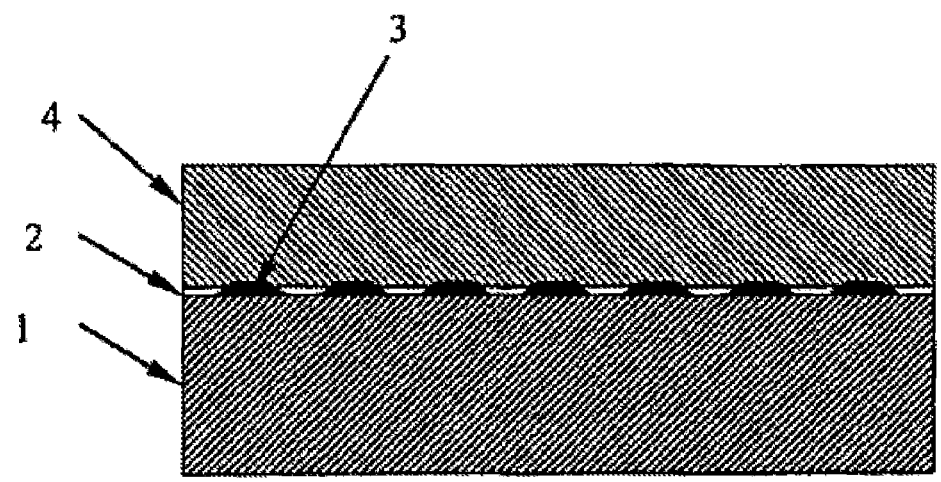
FIG. 1 illustrates the cross section of the InGaAlN multilayer structure grown on a Si substrate in accordance with embodiment 1 of the present invention.
Figure 2:
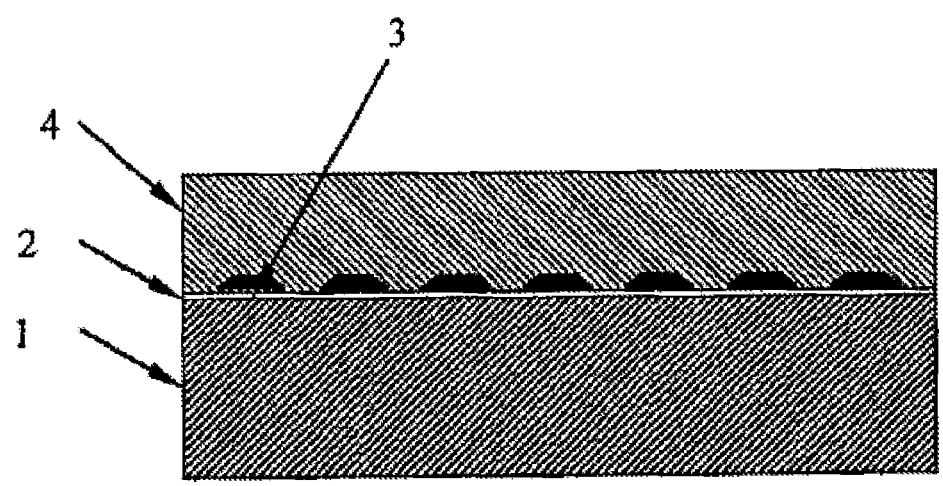
FIG. 2 illustrates the cross section of an InGaAlN multilayer structure grown on a Si substrate in accordance with embodiment 2 of the present invention.
Figure 3:
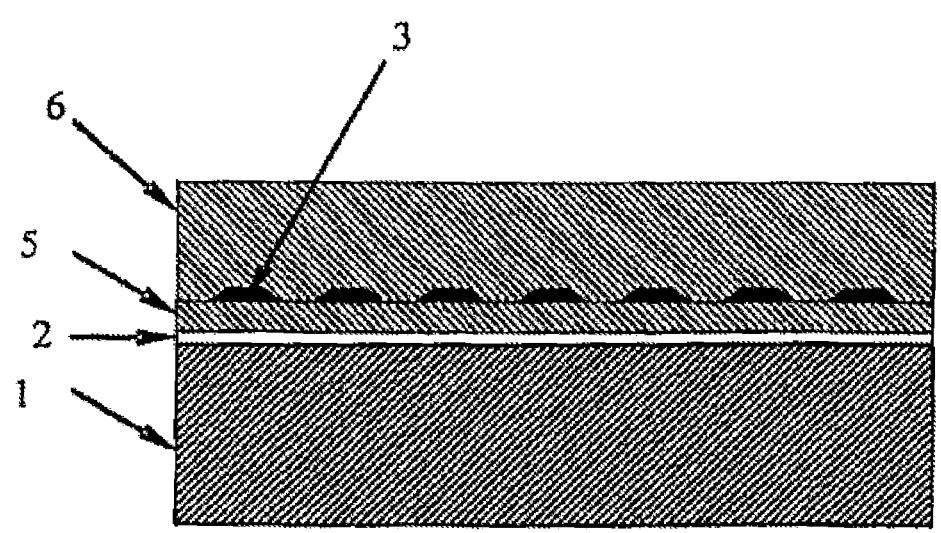
FIG. 3 illustrates the cross section of an InGaAlN multilayer structure grown on a Si substrate in accordance with embodiment 3 of the present invention.

In the figures, label "1" refers to a Si substrate, label "2" refers to a metal transition layer, label "3" refers to an Mg masking layer, label "4" refers to an InGaAlN layer, label "5" refers to a first InGaAlN layer, and label "6" refers to a second InGaAlN layer.

DETAILED DESCRIPTION OF EMBODIMENTS

The following description uses three embodiment examples to further describe methods provided by the present invention.

Embodiment 1

A Si (111) substrate 1 is cleaned and placed inside the reaction chamber of a metal-organic-chemical-vapor-deposition (MOCVD) machine. First, the surface of substrate 1 is thermally processed using $H_2$ for 5 minutes under high temperature. Then, the chamber temperature is lowered to below 720° C. A 0.5-mono-atomic-layer-thick of Mg mask layer 3 is deposited using bis(cyclopentadienyl)magnesium ($Cp_2Mg$) as the source. The Mg mask layer only covers part of the surface of the Si substrate, and the covered area is between 10% and 90% of the total surface area. Subsequently, a thin layer of Al, i.e., the metal transition layer 2, and an AlN buffer layer are deposited under the same chamber temperature of 720° C. In the end, the chamber temperature is raised to 1050° C., and a 3 μm thick GaN layer, i.e., the InGaAlN semiconductor layer 4, is deposited.

Embodiment 2

A Si (111) substrate 1 is cleaned and placed inside the reaction chamber of an MOCVD machine. First, substrate 1 is thermally processed using $H_2$ for 5 minutes under high temperature, then the chamber temperature is lowered to below 900° C., and a thin layer of Ti, i.e., the metal transition layer 2, is deposited. Subsequently, a mono-atomic layer of Mg is deposited to form the Mg mask layer 3, wherein the Mg mask layer only covers part of the surface of the metal transition layer and the covered area is between 10% and 90% of the total surface area. Afterwards, an AlN buffer layer is deposited while the chamber temperature is kept at 880° C. In the end, the chamber temperature is raised to 1030° C., and a 3 μm thick GaN layer, i.e., the InGaAlN semiconductor layer 4, is deposited.

Embodiment 3

A (111) Si substrate 1 is cleaned and placed inside the reaction chamber of an MOCVD machine. First, substrate 1 is thermally processed using $H_2$ for 5 minutes under high temperature, then the chamber temperature is lowered to below 800° C., and a thin layer of Al/Ti alloy, i.e., the metal transition layer 2, is deposited. An AlN buffer layer is deposited while the chamber temperature is kept at 800° C. Afterwards, the chamber temperature is raised to 1030° C., and a 0.5 μm thick first GaN layer, i.e., the first InGaAlN semiconductor layer 5, is deposited on the AlN layer. The thickness of the first InGaAlN semiconductor layer can be between one monoatomic layer and 3 μm. Subsequently, a two-mono-atomic-layer-thick Mg is deposited on the first GaN layer under the same chamber temperature to form Mg mask layer 3, wherein the Mg mask layer only covers part of the surface of the first InGaAlN semiconductor layer, and the covered area is between 10% and 90% of the total surface area. Then, a 2 μm thick GaN layer doped with Si, a 5-period InGaN/GaN multiple-quantum-well (MQW), and a 0.1 μm thick GaN layer doped with Mg, i.e., the second InGaAlN semiconductor layer 6, are deposited sequentially.

What is claimed is:

1. A method for fabricating InGaAlN thin film on a silicon substrate, the method comprising:
   forming an Mg mask layer on the Si substrate;
   forming a metal transition layer on said Mg mask layer; and
   forming an InGaAlN semiconductor layer on said metal transition layer;
   wherein said Mg mask layer only covers part of the surface of said Si substrate, and wherein the covered area is between 10% and 90% of the total surface area.

2. The method of claim 1,
   wherein said metal transition layer comprises an Al layer.

3. The method claim 1,
   wherein said metal transition layer comprises a Ti layer.

4. The method of claim 1,
   wherein said metal transition layer comprises an Al/Ti alloy layer.

5. The method of claim 1, further comprising:
   forming a buffer layer after the formation of said metal transition layer and before the formation of said InGaAlN semiconductor layer.

6. The method of claim 5,
wherein said buffer layer comprises an AlN layer.

7. A method for fabricating InGaAlN thin film on a silicon substrate, the method comprising:
   forming a metal transition layer on a Si substrate;
   forming an Mg mask layer on said metal transition layer; and
   forming an InGaAlN semiconductor layer on said Mg mask layer;
   wherein said Mg mask layer only covers part of the surface of said metal transition layer, and wherein the covered area is between 10% and 90% of the total surface area.

8. The method of claim 7,
wherein said metal transition layer comprises an Al layer.

9. The method of claim 7,
wherein said metal transition layer comprises a Ti layer.

10. The method of claim 7,
wherein said metal transition layer comprises an Al/Ti alloy layer.

11. The method of claim 7, further comprising:
    forming a buffer layer after the formation of said metal transition layer and before the formation of said InGaAlN semiconductor layer.

12. The method of claim 11,
wherein said buffer layer comprises an AlN layer.

13. A method for fabricating InGaAlN thin film on a silicon substrate, the method comprising:
    forming a metal transition layer on a Si substrate;
    forming a first InGaAlN semiconductor layer on said metal transition layer;
    forming an Mg mask layer on said first InGaAlN semiconductor layer; and
    forming a second InGaAlN semiconductor layer on said Mg mask layer;
    wherein said Mg mask layer only covers part of the surface of said first InGaAlN semiconductor layer, and wherein the covered area is between 10% and 90% of the total surface area.

14. The method of claim 13,
wherein said metal transition layer comprises an Al layer.

15. The method of claim 13,
wherein said metal transition layer comprises a Ti layer.

16. The method of claim 13,
wherein said metal transition layer comprises an Al/Ti alloy layer.

17. The method of claim 13,
wherein the thickness of said first InGaAlN semiconductor layer is between 1 mono-atomic layer and 3 μm.

18. The method of claim 13, further comprising:
    forming a buffer layer after the formation of said metal transition layer and before the formation of said first InGaAlN semiconductor layer.

19. The method of claim 18,
wherein said buffer layer comprises an AlN layer.

* * * * *